United States Patent [19]

Wang

[11] Patent Number: 5,416,046
[45] Date of Patent: May 16, 1995

[54] METHOD FOR MAKING SEMICONDUCTOR HEAT-COOLING DEVICE HAVING A SUPPORTING MESH

[76] Inventor: Ping-Lung Wang, No. 44 Lane 111 Minchuan Road, Hsinchu City, Taiwan, Prov. of China

[21] Appl. No.: 183,073

[22] Filed: Jan. 18, 1994

[51] Int. Cl.⁶ .......................................... H01L 21/60
[52] U.S. Cl. ...................................... 437/205; 437/9; 437/209; 437/248; 437/902; 257/796; 257/675
[58] Field of Search .................. 437/209, 9, 902, 248, 437/205, 218; 257/796, 67.5

[56] References Cited

U.S. PATENT DOCUMENTS

| | | | |
|---|---|---|---|
| 4,600,936 | 7/1986 | Khoury et al. | 357/79 |
| 4,709,468 | 12/1987 | Wilson | 437/209 |
| 5,158,912 | 10/1992 | Kellerman et al. | 437/902 |

Primary Examiner—Olik Chaudhuri
Assistant Examiner—Long Pham
Attorney, Agent, or Firm—Ostrolenk, Faber, Gerb & Soffen

[57] ABSTRACT

A method for manufacturing semiconductor heat-cooling devices. A semiconductor heat-cooling device has a plurality of semiconductor chips, an upper ceramic layer and a lower ceramic layer. By means of a supporting mesh between the upper layer and the lower layer, the semiconductor chips can be fixed and soldered to the conductive films on the inner surfaces of the two ceramic layers. The method not only increases the manufacturing yield rate and production throughput but also prevents moisture generated during the cooling process from entering the space between the ceramic layers. Short circuiting of semiconductor chips can also be avoided and the efficiency of the device can be maintained. By adding a sealing body to the edges of the supporting mesh, the space between the two ceramic layers is sealed. Erosion of and damage to the semiconductor chips is thus effectively minimized and the service life of the device is prolonged.

2 Claims, 3 Drawing Sheets

METHOD FOR MAKING SEMICONDUCTOR HEAT-COOLING DEVICE HAVING A SUPPORTING MESH

FIELD OF THE INVENTION

This invention relates to a method for manufacturing a semiconductor heat-cooling device, more specifically to the manufacturing of semiconductor heat-cooling devices involving using a supporting mesh to hold semiconductor chips in the heat-cooling device.

BACKGROUND OF THE INVENTION

Semiconductor heat-cooling devices have been widely used in industrial applications for heat dissipation and other cooling purposes. The device generates different temperatures on the two sides of its semiconductor interface. The side that generates cold energy can be used to dissipate heat being generated by electrical appliances, computers or heat tracking devices on missiles. As shown in FIG. 1, the conventional approach of manufacturing a semiconductor heat-cooling device uses a lower layer 20 and an upper layer 10 of ceramic material. The ceramic layers have a number of electrically-conductive films 11, 21 of rectangular shape. The semiconductor chips 30 are first positioned and aligned one by one on the films 21 of the lower ceramic layer 20. The upper ceramic layer 10 is then placed on top of the semiconductor chips 30 in such a way that its conductive films 11 are aligned to the semiconductor chips 30. The layout of the conductive films on the two ceramic layers are shown in FIG. 3. The conductive films and the semiconductor chips are able to form an electrically-conductive loop. Two conductive leads 40 are soldered to the two ends of the lower ceramic layer to form the conductive loop.

There are several drawbacks in the above method of manufacturing the heat-cooling devices:

1. Since semiconductor chips are small and granular, manually positioning and aligning the semiconductor chips is very difficult and the chips are easy to collapse. The process is very tiring to the operators. Usually, one can only align one or two devices in a day.
2. There is space between the upper and the lower ceramic layers. The moisture produced in the cooling process can easily enter the space. The moisture can cause a short circuit of the semiconductor chips and decreases the efficiency of the device. In some cases, it may result in failure the devices.
3. The manufacturing cost is very high. The production throughput is low and it cannot be mass-produced.
4. Manually positioning and aligning are not very accurate. The loss in yield is often very high.

SUMMARY OF THE INVENTION

The present invention has been made to overcome the above drawbacks. The object of this invention is to provide an efficient and accurate method for manufacturing the semiconductor heat-cooling device in order to reduce the manufacturing cost, decrease the yield loss and make mass-production possible. The invention uses a supporting mesh that has a plurality of holes to support the semiconductor chips between the upper and the lower ceramic layers. The electrically-conductive films on the inner surfaces of the two ceramic layers are then soldered to the two ends of the semiconductor chips by a melting solder machine. In addition, sealing material provided on the edges of the supporting mesh is used to seal the space between the upper ceramic layer and the lower ceramic layer. The invention increases the manufacturing throughput and yield rate of semiconductor heat-cooling devices. It also prevents the moisture generated during the cooling process from entering the space inside the device. The failure rate of semiconductor chips due to short circuits is greatly reduced. It is especially effective in preventing erosion of the device when used in aviation technology.

DETAILED DESCRIPTION OF THE PREFERRED EMBODIMENTS

Figure 1:
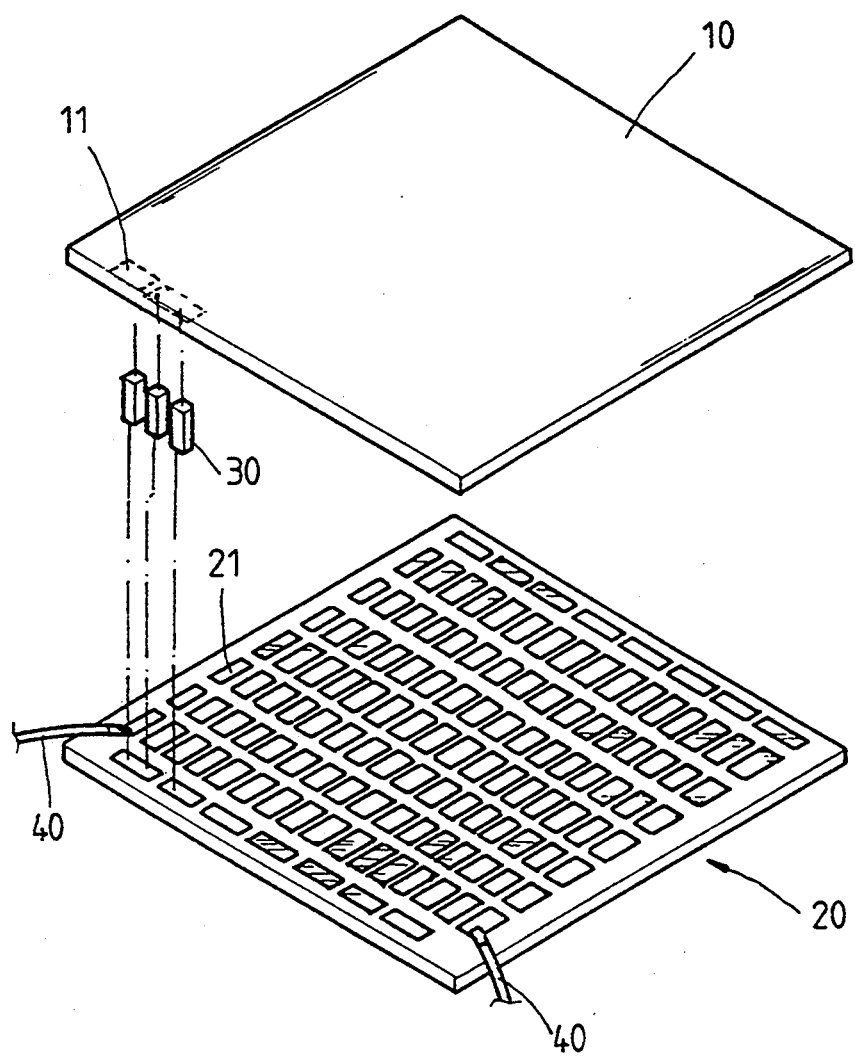
FIG. 1 is a schematic diagram of a conventional semiconductor heat-cooling device and its manufacturing procedure.
Figure 2:
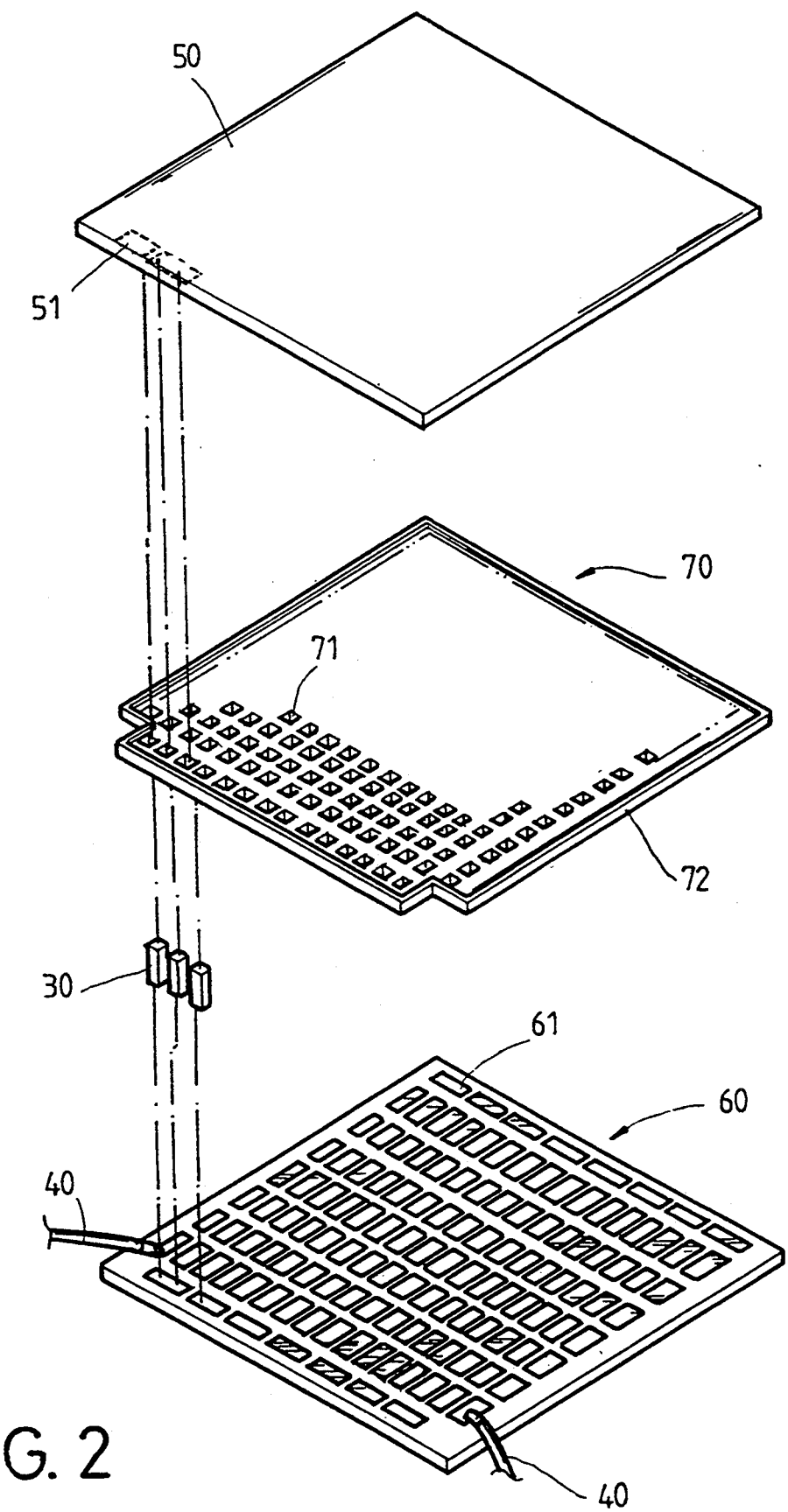
FIG. 2 shows a schematic diagram of a semiconductor heat-cooling device and its manufacturing procedure of this invention.
Figure 3:
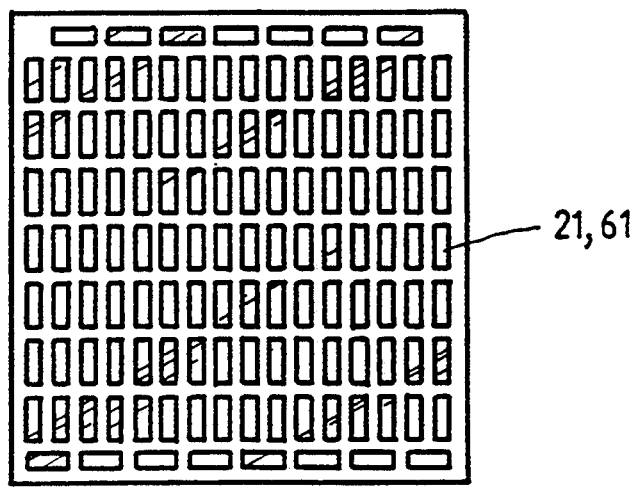
FIG. 3 show layouts of electrically-conductive films on the upper and the lower ceramic layers.
Figure 3A:
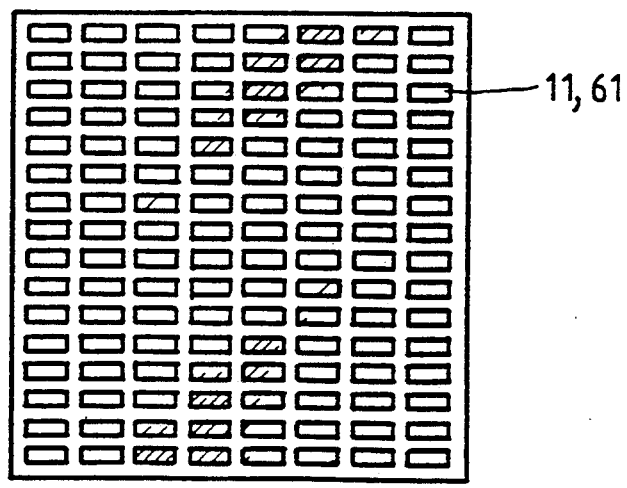

With reference to FIG. 2, the structure and manufacturing procedure of this invention will be described. As shown in the figure, the embodiments of this invention comprise an upper ceramic layer 50, a lower ceramic layer 60, two conductive leads 40 and a plurality of semiconductor chips 30. There are a number of electrically-conductive films 51, 61 on the inner surfaces of the ceramic layers. The layouts of the conductive films 11, 51, 21, 61 on the upper and the lower layers are shown in FIG. 3. The procedure of manufacturing the semiconductor heat-cooling device is as follows:

1. A plurality of conductive films 51, 61 of rectangular shape are prepared and laid out on the inner surfaces of the upper 50 and the lower 60 ceramic layers as shown in FIG. 3. The conductive films can be used to form an electrically-conductive loop.
2. A supporting mesh 70 having a plurality of holes 71 is positioned above the lower ceramic layer 60. All the holes on the mesh are aligned and positioned directly above the conductive films 61 to provide an exact match between the holes and the conductive films.
3. Every hole 71 on the mesh 70 is filled with a semiconductor chip 30.
4. The lower ceramic layer 60 along with the supporting mesh 70 and the semiconductor chips 30 are placed in a plate. The plate is then shaken to make the semiconductor chips 30 fall completely in the holes 71 of the mesh 70 and one end of the semiconductor chips contact the conductive film 61 of the ceramic layer 60.
5. The upper ceramic layer 50 is positioned precisely above the semiconductor chips 30 that are held in the holes 71 of the supporting mesh 70. The conductive films 51 are in contact with the other end of the semiconductor chips.
6. The combined body of the ceramic layers and the supporting mesh is heated by a melting solder machine to solder the two ends of the semiconductor chips to the conductive films of the ceramic layers.

7. Two conductive leads 40 are soldered to the conductive films on the lower ceramic layer as shown in FIG. 2 to form a series electrical loop.

The semiconductor heat-cooling device described above can generate cold energy on one side of the device and hot energy on the other side. The cold energy can be used for heat dissipation or cooling. Heat dissipation for central processors or missile heads and cooling for refrigerators or air conditioners of automobiles are examples of applications. As shown in FIG. 2, the supporting mesh 70 has a sealing body 72 on its four edges. The sealing body can seal the space between the upper and the lower ceramic layers to prevent moisture from entering the space. This minimizes the possibility of short circuits in the semiconductor chips.

In summary, the supporting mesh in the invention has the following advantages:

a. The supporting mesh can reduce the vibration of semiconductor chips and increase the service life of the device.

b. The supporting mesh provides a sealing body to seal the space between the ceramic layers. It can prevent moisture, dirt and other foreign material from entering the space. It also increases stiffness of the device.

c. The supporting mesh increases the efficiency and accuracy of the device because it prevents the semiconductor chips from short circuits caused by either moisture or the collapse of the semiconductor chips.

d. The supporting mesh increases the safety of using the device. The semiconductor chips are completely isolated from any outside metal or conductive material.

As described above, this invention presents a new structure and manufacturing procedure for semiconductor heat-cooling devices. The preferred embodiment has been shown and illustrated. It is requested that all changes and modifications that come within the spirit of the invention be protected.

What is claimed is:

1. A method for manufacturing a semiconductor heat-cooling device, said device having an upper ceramic layer, a lower ceramic layer, a supporting mesh including a plurality of holes, two conductive leads, a plurality of semiconductor chips, a plurality of rectangular conductive films on the inner surface of said lower layer, said method comprising the steps of:

a. preparing a first layout of the conductive films on said upper layer and a second layout of the conductive films on said lower layer, said first layout and said second layout together with said plurality of semiconductor chips forming a series electrical loop;

b. positioning said supporting mesh above said lower layer, whereby said holes of said mesh match the conductive films on said lower layer;

c. filling each of said holes with one of said semiconductor chips;

d. placing a combined body formed by said lower layer, said supporting mesh and said semiconductor chips on a plate and shaking the plate to position said semiconductor chips completely in said holes, wherein each of said semiconductor chips has one end in contact with one of the conductive films of said lower layer;

e. positioning said upper layer above said semiconductor chips, wherein the inner surface of said upper layer is facing said semiconductor chips and each of said semiconductor chips has the other end in contact with one of the conductive films of said upper layer;

f. heating the combined body of said upper layer, said lower layer, said supporting mesh and said semiconductor chips with a melting solder device to solder said semiconductor chips to the conductive films on said upper layer and the conductive films on said lower layer; and g. soldering said conductive leads to said lower layer to form a series electrical loop.

2. The method for manufacturing a semiconductor heat-cooling device according to claim 1, said supporting mesh having a sealing body on its four edges, further comprising the step of sealing the space between said upper layer and said lower layer using said sealing body.

* * * * *